(12) United States Patent
Nakajiki

(10) Patent No.: US 12,672,373 B2
(45) Date of Patent: Jun. 30, 2026

(54) LIGHT DETECTION ELEMENT

(71) Applicant: SONY SEMICONDUCTOR SOLUTIONS CORPORATION, Kanagawa (JP)

(72) Inventor: Sintaro Nakajiki, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 283 days.

(21) Appl. No.: 18/548,652

(22) PCT Filed: Feb. 4, 2022

(86) PCT No.: PCT/JP2022/004457
§ 371 (c)(1),
(2) Date: Sep. 1, 2023

(87) PCT Pub. No.: WO2022/190732
PCT Pub. Date: Sep. 15, 2022

(65) Prior Publication Data
US 2024/0162261 A1 May 16, 2024

(30) Foreign Application Priority Data
Mar. 10, 2021 (JP) ................................. 2021-038689

(51) Int. Cl.
*H10F 39/00* (2025.01)
*H10F 39/18* (2025.01)
(52) U.S. Cl.
CPC ....... *H10F 39/8053* (2025.01); *H10F 39/184* (2025.01); *H10F 39/8023* (2025.01); *H10F 39/8057* (2025.01); *H10F 39/8063* (2025.01)

(58) Field of Classification Search
CPC ............. H10F 39/8053; H10F 39/8023; H10F 39/8063; H10F 39/184; H10F 39/8057
See application file for complete search history.

(56) References Cited

U.S. PATENT DOCUMENTS

| | | | |
|---|---|---|---|
| 2007/0045517 A1 | 3/2007 | Fukuyoshi et al. | |
| 2007/0187794 A1 | 8/2007 | Fukuyoshi et al. | |
| 2015/0130005 A1 | 5/2015 | Ko et al. | |
| 2015/0381907 A1* | 12/2015 | Boettiger ............. | H10F 39/806 |
| | | | 348/164 |
| 2016/0233259 A1 | 8/2016 | Sekine | |
| 2019/0243039 A1 | 8/2019 | Takishita et al. | |
| 2023/0102241 A1* | 3/2023 | Hashi ................... | G01S 7/4816 |
| | | | 250/208.2 |

(Continued)

FOREIGN PATENT DOCUMENTS

| | | |
|---|---|---|
| EP | 1788627 A1 | 5/2007 |
| EP | 1892763 A1 | 2/2008 |

(Continued)

OTHER PUBLICATIONS

International Search Report and Written Opinion prepared by the Japan Patent Office on Apr. 14, 2022, for International Application No. PCT/JP2022/004457, 3 pgs.

*Primary Examiner* — Richard A Booth
(74) *Attorney, Agent, or Firm* — SHERIDAN ROSS P.C.

(57) ABSTRACT

A light detection element includes a substrate on which a plurality of light reception units is arranged in pixel units, and a filter formed over a plurality of adjacent pixels on the substrate, the filter that cuts visible light and transmits infrared light.

20 Claims, 16 Drawing Sheets

(56) References Cited

U.S. PATENT DOCUMENTS

2024/0031703 A1\* 1/2024 Tsujiai ................ H10F 39/8053

FOREIGN PATENT DOCUMENTS

| | | |
|---|---|---|
| JP | 2007-049224 | 2/2007 |
| JP | 2007-053153 | 3/2007 |
| JP | 2016-149417 | 8/2016 |
| JP | 2019149417 A | 9/2019 |
| JP | 2020-017791 | 1/2020 |
| JP | 2020-076990 | 5/2020 |
| KR | 20070029710 A | 3/2007 |
| KR | 20150055887 A | 5/2015 |
| TW | 202039701 A | 11/2020 |
| WO | WO 2006/003807 | 1/2006 |
| WO | WO-2006134740 A1 | 12/2006 |
| WO | WO 2018/092600 | 5/2018 |

\* cited by examiner

FIG. 1

LIGHT DETECTION ELEMENT

CROSS REFERENCE TO RELATED APPLICATIONS

This application is a national stage application under 35 U.S.C. 371 and claims the benefit of PCT Application No. PCT/JP2022/004457, having an international filing date of 4 Feb. 2022, which designated the United States, which PCT application claimed the benefit of Japanese Patent Application No. 2021-038689, filed 10 Mar. 2021, the entire disclosures of each of which are incorporated herein by reference.

TECHNICAL FIELD

The present technology relates to a light detection element, and especially relates to a technical field of a light detection element that detects infrared light.

BACKGROUND ART

As a filter that cuts visible light and transmits infrared light, there has been proposed a filter in which a dielectric multilayer film that transmits infrared light of a predetermined wavelength is formed on a glass substrate provided separated from a sensor (refer to, for example, Patent Document 1 below).

CITATION LIST

Patent Document

Patent Document 1: Japanese Patent Application Laid-Open No. 2020-76990

SUMMARY OF THE INVENTION

Problems to be Solved by the Invention

In the filter disclosed in Patent Document 1, since a plurality of inorganic films having different refractive indexes are stacked, a wavelength of transmitted light changes depending on an incident angle of light. Therefore, in the light detection element using the filter disclosed in Patent Document 1, detection accuracy of infrared light might be deteriorated.

The present technology has been made in view of the circumstances described above, and an object thereof is to improve detection accuracy of infrared light.

Solutions to Problems

A light detection element according to the present technology includes a substrate on which a plurality of light reception units is arranged in pixel units, and a filter formed over a plurality of adjacent pixels on the substrate, the filter that cuts visible light and transmits infrared light.

Therefore, when receiving the infrared light by the light reception unit of each pixel, it becomes possible that the light reception unit receives the infrared light in which a change in wavelength due to a difference in incident angle of light is reduced.

Note that, "formed on the substrate" includes a case of being formed directly on the substrate and a case of being formed on the substrate via another member.

In the light detection element according to the present technology described above, it is conceivable that the filter is formed on an entire effective pixel region in which effective pixels that detect the infrared light are arranged.

Therefore, when receiving the infrared light by the light reception unit of at least the effective pixel arranged in the effective pixel region, it becomes possible that the light reception unit receives the infrared light in which the change in wavelength due to the difference in incident angle of light is reduced.

In the light detection element according to the present technology described above, it is conceivable that the filter is formed on an entire dummy pixel region in which dummy pixels are arranged provided on an outside of the effective pixel region.

Therefore, since the visible light is cut also in the dummy pixel region, it becomes possible to reduce color mixing from the dummy pixel and the visible light reflected by the dummy pixel region.

In the light detection element according to the present technology described above, it is conceivable that the filter is formed on an entire light-shielded pixel region in which light-shielded pixels are arranged provided on an outside of the dummy pixel region.

Therefore, since the visible light is cut also in the light-shielded pixel region, it becomes possible to reduce the visible light reflected by the light-shielded pixel region.

In the light detection element according to the present technology described above, it is conceivable that the filter is formed on an entire substrate.

This makes it possible to reduce the visible light reflected on the substrate.

In the light detection element according to the present technology described above, it is conceivable that the filter includes an organic resin composition in which a color material that cuts the visible light is dispersed in an organic resin.

This makes it possible to transmit infrared light of any wavelength.

In the light detection element according to the present technology described above, it is conceivable that the filter includes a same material as a material of a microlens that condenses light on the light reception unit, and is formed integrally with the microlens.

This makes it possible to form the filter and the microlens at once.

It is conceivable that the light detection element according to the present technology described above includes a microlens formed on the substrate, the microlens that condenses light on the light reception unit, in which the filter is formed on the microlens formed on the substrate.

Therefore, it is possible to condense only the infrared light by the microlens.

In the light detection element according to the present technology described above, it is conceivable that the filter is formed except for a part of effective pixels in an effective pixel region.

Therefore, a part of the effective pixels may receive the visible light.

It is conceivable that the light detection element according to the present technology described above includes a light-shielding film formed on an outside of an effective pixel region, the light-shielding film that cuts at least the infrared light, in which the filter is formed on a side closer to the substrate than the light-shielding film.

This makes it possible to reduce reflection of the infrared light on the outside of the effective pixel region.

It is conceivable that the light detection element according to the present technology described above includes a light-shielding film formed on an outside of an effective pixel region, the light-shielding film that cuts at least the infrared light, in which the filter is formed at a position separated from the substrate than the light-shielding film.

This makes it possible to reduce reflection of the infrared light on the outside of the effective pixel region.

In the light detection element according to the present technology described above, it is conceivable that the light-shielding film cuts the visible light and the infrared light.

This makes it possible to further reduce the reflection of the visible light.

In the light detection element according to the present technology described above, it is conceivable that the light-shielding film includes an organic resin composition in which a color material that cuts the visible light is dispersed in an organic resin.

This makes it possible to reduce an influence of the incident angle of the light.

BRIEF DESCRIPTION OF DRAWINGS

FIG. 1 is a block diagram for describing a configuration example of a light detection element according to the present technology.

MODE FOR CARRYING OUT THE INVENTION

Figures 2, 3:
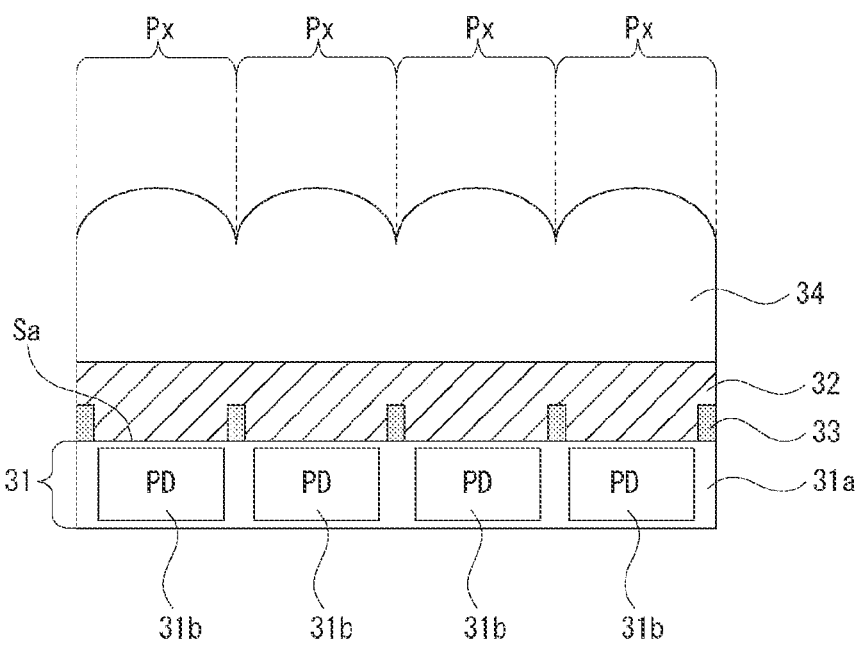
FIG. 2 is a cross-sectional view for describing a configuration example of a pixel array unit.
FIG. 3 is a diagram for describing a filter arrangement in the pixel array unit.

Hereinafter, embodiments according to the present technology will be described in the following order with reference to the accompanying drawings.

<1. Configuration of Light Detection Element>
<2. Configuration of Pixel Array Unit>
<3. Pixel Formation Processing>
<4. Formation Range of Infrared Pass Filter>
<5. Configuration Example of Separation Wall>
<6. Configuration Example of Semiconductor Substrate>
<7. Application Example of Light Detection Element>
<8. Variation>
<9. Summary of Embodiment>
<10. Present Technology>

1. Configuration of Light Detection Element

Figure 1:
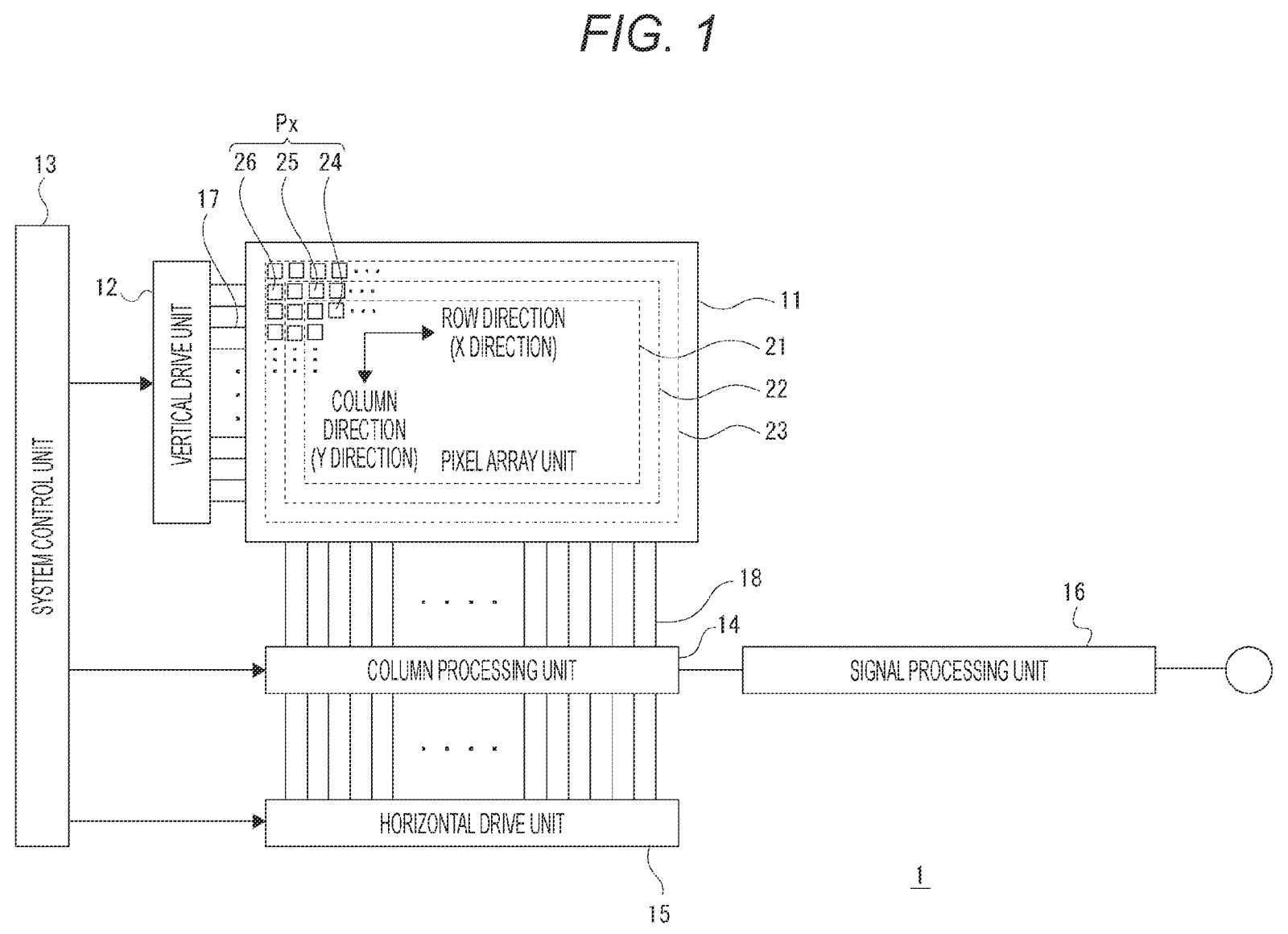

FIG. 1 is a block diagram for describing a configuration example of a light detection element 1 according to the present technology. As illustrated in FIG. 1, the light detection element 1 is provided with a pixel array unit 11, a vertical drive unit 12, a system control unit 13, a column processing unit 14, a horizontal drive unit 15, and a signal processing unit 16.

In the pixel array unit 11, a plurality of pixels Px is two-dimensionally arranged in a matrix in a row direction and a column direction. Each pixel Px includes a photodiode PD as a light reception unit.

Here, the row direction refers to an arrangement direction of the pixels Px in a horizontal direction, and the column direction refers to an arrangement direction of the pixels Px in a vertical direction. In the drawing, the row direction is a lateral direction, and the column direction is a longitudinal direction.

Note that, hereinafter, the row direction and the column direction are sometimes referred to as an "X direction" and a "Y direction", respectively. Furthermore, a direction orthogonal to an X-Y plane (that is, a thickness direction of the light detection element 1) is sometimes referred to as a "Z direction".

An effective pixel region 21, a dummy pixel region 22, and a light-shielded pixel region 23 are provided in the pixel array unit 11. The effective pixel region 21 is provided at the center of the pixel array unit 11, in which a large majority of pixels Px are arranged. The dummy pixel region 22 is provided on an outer periphery of the effective pixel region 21, in which the pixels Px are arranged so as to surround the effective pixel region 21. The light-shielded pixel region 23 is provided on an outer periphery of the dummy pixel region 22, in which the pixels Px are arranged so as to surround the dummy pixel region 22. Note that, the dummy pixel region 22 and the light-shielded pixel region 23 may be provided adjacent to only one side or a plurality of sides of the outer periphery of the effective pixel region 21.

Hereinafter, the pixels Px arranged in the effective pixel region 21 are sometimes referred to as effective pixels 24, the pixels Px arranged in the dummy pixel region 22 are sometimes referred to as dummy pixels 25, and the pixels Px arranged in the light-shielded pixel region 23 are sometimes referred to as light-shielded pixels (optical black pixels) 26. Furthermore, in a case where the effective pixel 24, the dummy pixel 25, and the light-shielded pixel 26 are described without distinction, they are referred to as the pixels Px.

The effective pixel 24 receives incident light (infrared light). The dummy pixel 25 is a pixel provided for stabilizing pixel characteristics of the effective pixel 24 and the light-shielded pixel 26, and may receive the incident light (infrared light). The light-shielded pixel 26 is a pixel for correcting a dark current, and is shielded from light so as not to receive light as will be described later in detail.

In the pixel array unit 11, with respect to a pixel array in a matrix, a row drive line 17 is wired in the row direction for each pixel row, and a vertical signal line 18 is wired in the column direction for each pixel column. For example, the row drive line 17 transmits a drive signal for driving when reading a signal from the pixel Px. One end of the row drive line 17 is connected to an output end corresponding to each row of the vertical drive unit 12.

The system control unit 13 includes a timing generator that generates various timing signals and the like, and performs drive control of the vertical drive unit 12, the column processing unit 14, the horizontal drive unit 15 and the like on the basis of the various timing signals generated by the timing generator.

The vertical drive unit 12 includes a shift register, an address decoder and the like, and drives the pixels Px of the pixel array unit 11 at the same time for all the pixels, in units of rows or the like. That is, the vertical drive unit 12 forms a drive control unit that controls an operation of each pixel Px of the pixel array unit 11 together with the system control unit 13 that controls the vertical drive unit 12.

A detection signal output (read) from each pixel Px of the pixel row according to the drive control by the vertical drive unit 12, specifically, a signal corresponding to a signal charge accumulated in a floating diffusion provided for each pixel Px is input to the column processing unit 14 via a corresponding vertical signal line 18. The column processing unit 14 performs predetermined signal processing on the detection signal read from each pixel Px via the vertical signal line 18, and temporarily holds the detection signal after the signal processing. Specifically, the column processing unit 14 performs noise removal processing, analog to digital (A/D) conversion processing and the like as the signal processing.

The horizontal drive unit 15 includes a shift register, an address decoder and the like, and sequentially selects a unit circuit corresponding to the pixel column of the column processing unit 14. By selective scanning by the horizontal drive unit 15, the detection signals subjected to the signal processing in each unit circuit in the column processing unit 14 are sequentially output.

The signal processing unit 16 at least has an operation processing function, and performs various types of signal processing on the detection signals output from the column processing unit 14 to output. For example, there is a case where the signal processing unit 16 performs only buffering or performs black level adjustment, column variation correction, various types of digital signal processing and the like.

2. Configuration of Pixel Array Unit

FIG. 2 is a cross-sectional view for describing a configuration example of the pixel array unit 11. FIG. 3 is a diagram for describing a filter arrangement in the pixel array unit 11. As illustrated in FIG. 2, the pixel array unit 11 receives incident light from one surface Sa side (upper side in the drawing) of a semiconductor substrate 31 on which the photodiodes PD are formed in pixel units.

The semiconductor substrate 31 includes, for example, silicon (Si), and is formed with a thickness of, for example, about 1 μm to 6 μm. In the semiconductor substrate 31, for example, N-type (second conductive type) semiconductor regions 31$b$ are formed in a P-type (first conductive type) semiconductor region 31$a$ in pixel units, so that the photodiodes PD are formed in pixel units. The P-type semiconductor region 31$a$ provided on both surface sides of the semiconductor substrate 31 also serves as a hole charge accumulation region for suppressing a dark current.

The one surface Sa of the semiconductor substrate 31 serves as a light incident surface on which light is incident. An infrared pass filter 32 is formed on the one surface Sa of the semiconductor substrate 31. The infrared pass filter 32 is formed over a plurality of adjacent pixels, and is formed over all the pixels Px as indicated by "IR" in FIG. 3 as an example.

The infrared pass filter 32 is a filter that cuts (absorbs) visible light and transmits infrared light. Specifically, the infrared pass filter 32 is an organic resin composition containing a color material that cuts the visible light dispersed in an organic resin. The organic resin composition desirably is a photocurable composition containing at least a photopolymerization initiator or a thermosetting composition containing at least a thermosetting resin.

The color material desirably has a transmission spectral characteristic of cutting the visible light of a predetermined wavelength and transmitting the infrared light of a predetermined wavelength. As the color material, for example, a plurality of organic pigments having a high light-shielding property in a visible light region of red, green, and blue, and a low light-shielding property in an infrared region are mixed.

Examples of the organic pigment may include, for example, C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37;

C.I. Pigment Brown 25, 28;

C.I. Pigment Black 1, 7;

and the like.

Furthermore, in addition to the organic pigment, it is also possible to add a near-infrared absorbing dye to the organic resin composition. Examples of the near-infrared absorbing dye may include, for example, a pyrrolopyrrole dye, a copper compound, a cyanine dye, a phthalocyanine compound, an imonium compound, a thiol complex compound, a transition metal oxide compound, a squarylium dye, a naphthalocyanine dye, a quaterrylene dye, a dithiol metal complex dye, a croconium compound and the like.

Figure 4:
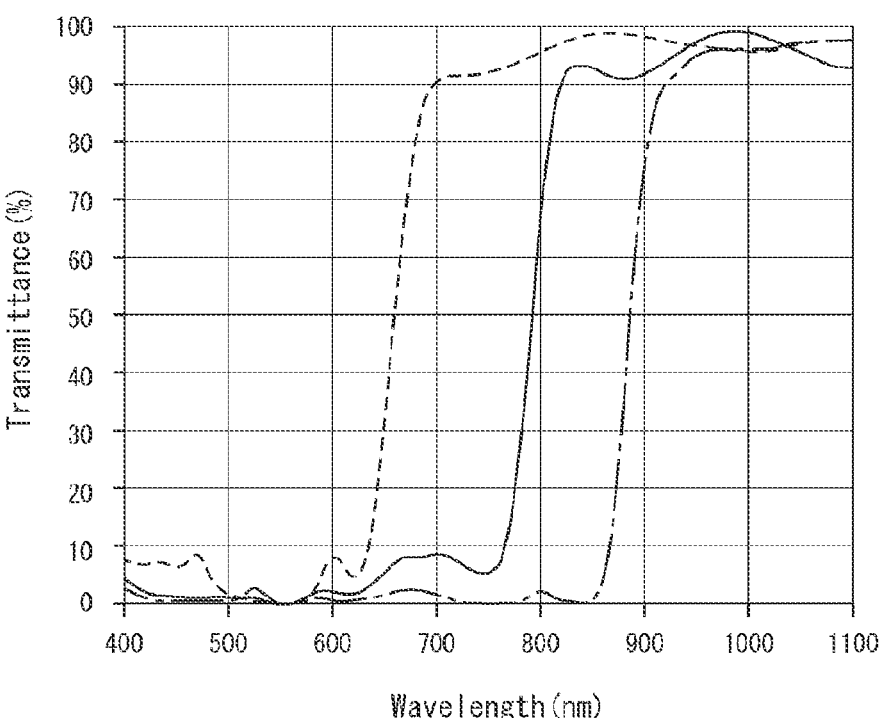
FIG. 4 is a diagram illustrating an example of a spectral characteristic of an infrared pass filter.

FIG. 4 is a diagram illustrating an example of a spectral characteristic of the infrared pass filter 32. The infrared pass filter 32 contains the organic pigment described above or the organic pigment and near-infrared absorbing dye dispersed in the organic resin, so that this may have, for example, the spectral characteristic as illustrated in FIG. 4.

As indicated by a broken line in FIG. 4, the infrared pass filter 32 may have transmittance of 10% or less in a wavelength range of about 650 nm or less, and transmittance of 90% or more in a wavelength range higher than about 650 nm.

Furthermore, as indicated by a solid line in FIG. 4, the infrared pass filter 32 may have transmittance of 10% or less in a wavelength range of about 800 nm or less, and transmittance of 90% or more in a wavelength range higher than about 800 nm.

Furthermore, as indicated by a dashed-dotted line in FIG. 4, the infrared pass filter 32 may have transmittance of 10% or less in a wavelength range of about 900 nm or less, and transmittance of 90% or more in a wavelength range higher than about 900 nm.

Returning to FIG. 2, on the semiconductor substrate 31 and in the infrared pass filter 32, a separation wall 33 for preventing incidence of the incident light on adjacent pixels (color mixing) is formed. The separation wall 33 is formed in a lattice shape so as to open on the photodiode PD of each pixel Px. The separation wall 33 desirably has a height in the Z direction of at least 100 nm or more, the height equal to or less than the height (thickness) of the infrared pass filter 32.

A light-shielding material may be used as a material of the separation wall 33; for example, a metal material (metal film) such as tungsten (W), aluminum (Al), or copper (Cu) may be used. Between adjacent pixels Px, the separation wall 33 prevents light that should be incident only on one pixel Px from leaking into another pixel Px.

A microlens 34 is formed on the infrared pass filter 32 for each pixel Px. The microlens 34 is formed using a resin material (lens material) such as a styrene resin, an acrylic resin, a styrene-acrylic copolymer resin, or a siloxane resin, for example. Light condensed by the microlens 34 is efficiently incident on the photodiode PD.

3. Pixel Formation Processing

Figure 5:
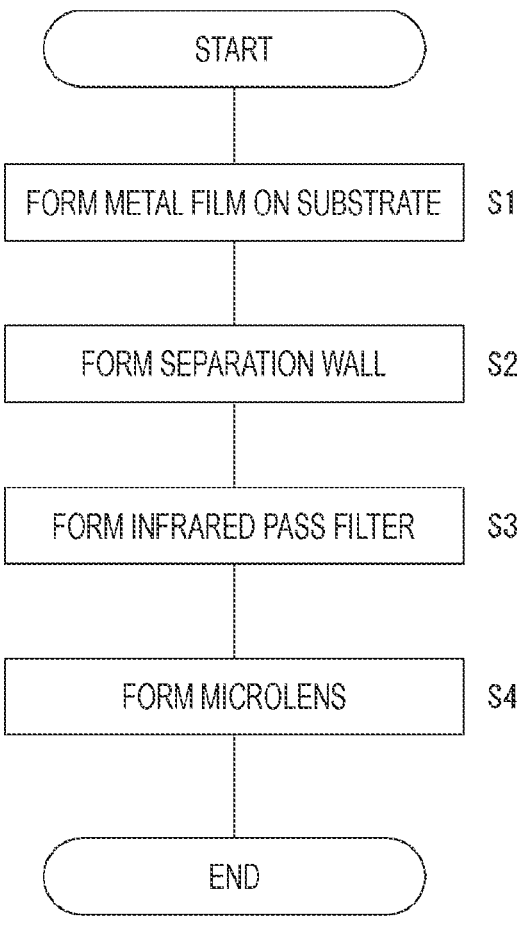
FIG. 5 is a flowchart illustrating a flow of pixel formation processing.
Figure 6:
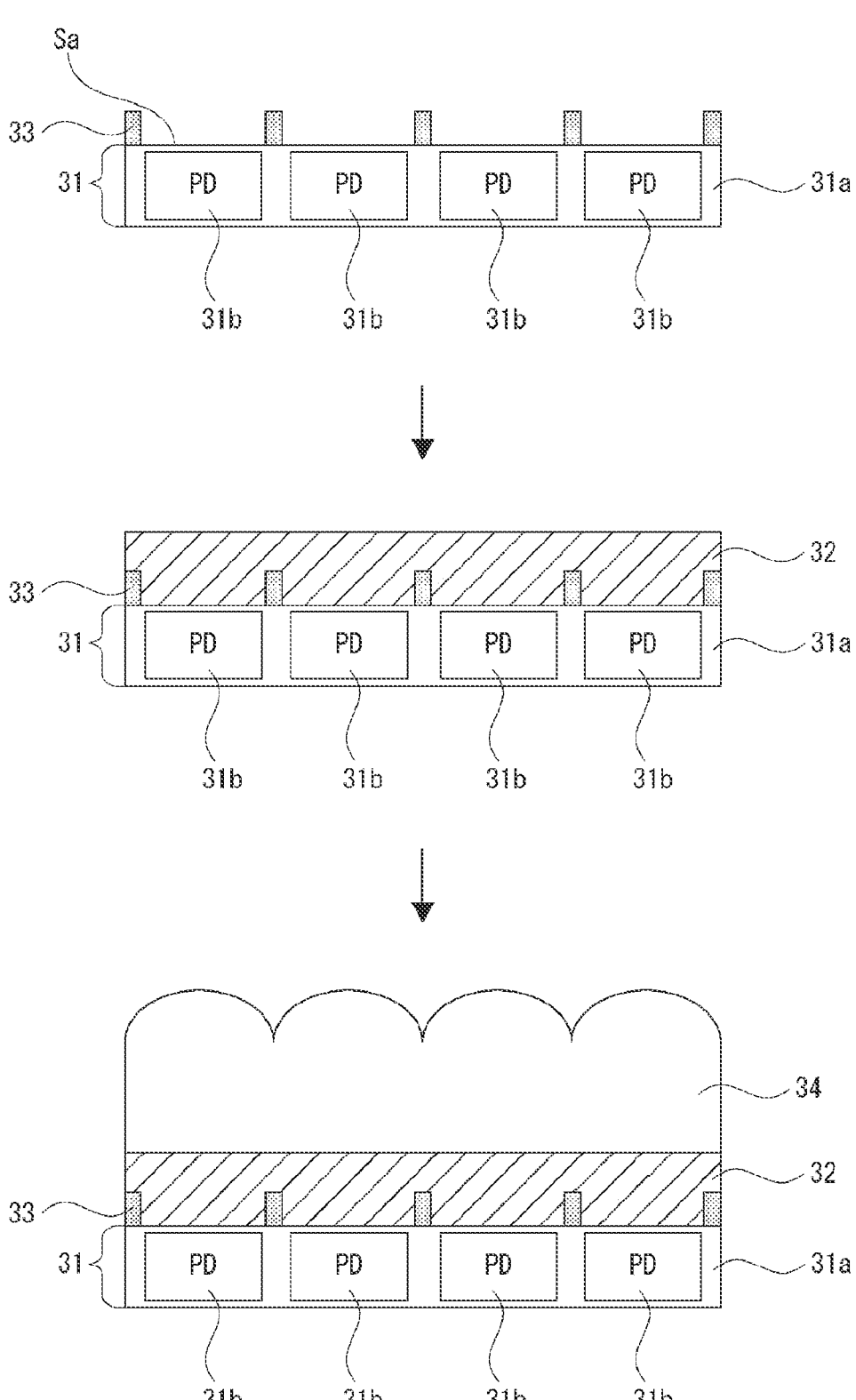
FIG. 6 is a diagram for describing a flow of the pixel formation processing.

FIG. 5 is a flowchart illustrating a flow of pixel formation processing. FIG. 6 is a diagram for describing a flow of the pixel formation processing. Next, a flow of processing until the pixel Px is formed in the pixel array unit 11 is described. Note that, hereinafter, processing after the photodiode PD is formed on the semiconductor substrate 31 is described.

At step S1 in FIG. 5, the metal film to be the material of the separation wall 33 is formed on the one surface Sa of the semiconductor substrate 31. At step S2, a photoresist is applied to a region in which the separation wall 33 is to be formed, exposed and developed by photolithography, and further dry-etched, so that the separation wall 33 is formed as illustrated in an upper side of FIG. 6.

At step S3, the organic resin composition to be the material of the infrared pass filter 32 is coated on the one surface Sa of the semiconductor substrate 31 by spin coating. Then, since the organic resin composition has a photolithography performance, the organic resin composition is directly exposed and developed to form the infrared pass filter 32 as illustrated in the center of FIG. 6.

At step S4, a lens material to be the material of the microlens 34 is applied onto the infrared pass filter 32. Then, positive resist patterning processing, lens shape forming processing by thermal reflow, and microlens shape transfer processing by dry etching are sequentially performed on the lens material to form the microlens 34 as illustrated in a lower side of FIG. 6.

4. Formation Range of Infrared Pass Filter 32

Figure 7:
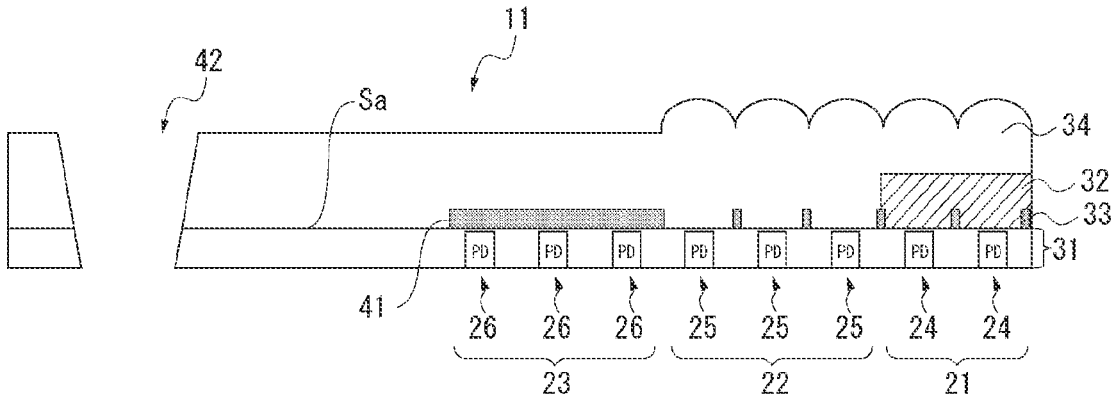
FIG. 7 is a diagram illustrating a first example of a formation range of the infrared pass filter.
Figure 8:
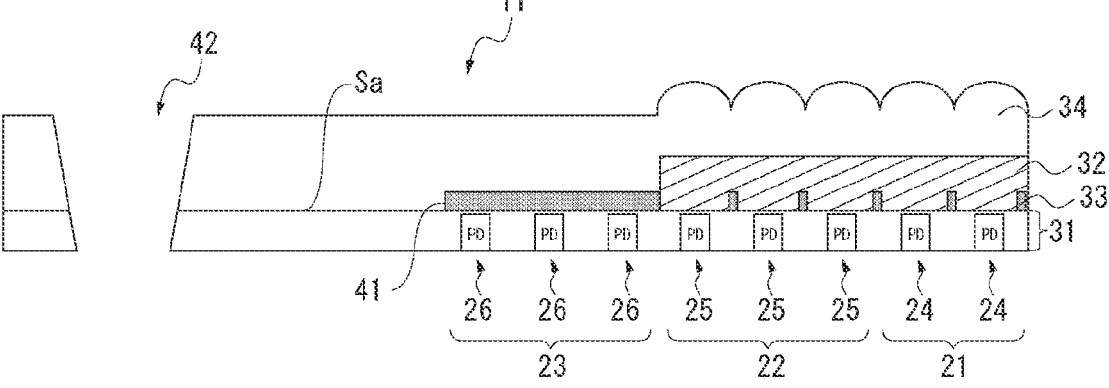
FIG. 8 is a diagram illustrating a second example of the formation range of the infrared pass filter.
Figure 9:
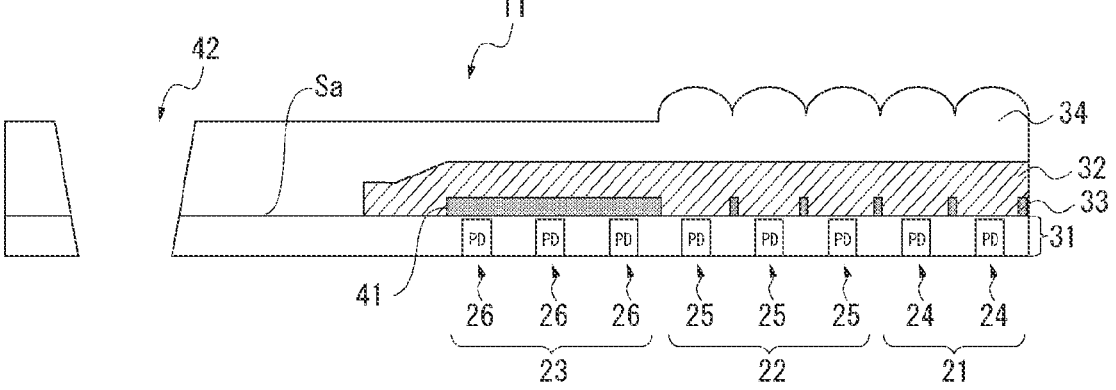
FIG. 9 is a diagram illustrating a third example of the formation range of the infrared pass filter.
Figure 10:
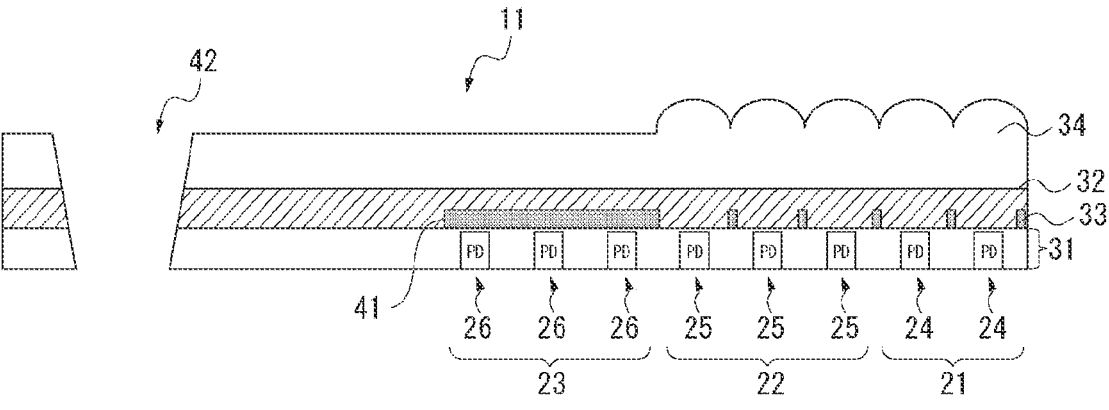
FIG. 10 is a diagram illustrating a fourth example of the formation range of the infrared pass filter.
Figure 11:
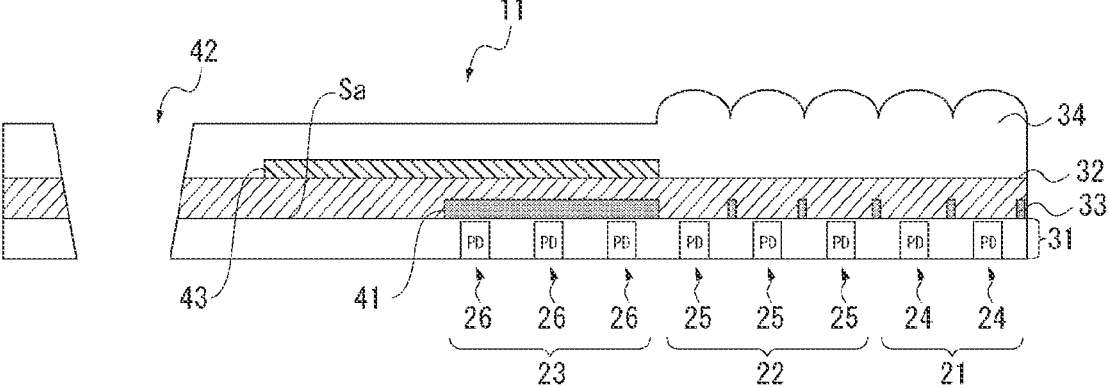
FIG. 11 is a diagram illustrating a fifth example of the formation range of the infrared pass filter.
Figure 12:
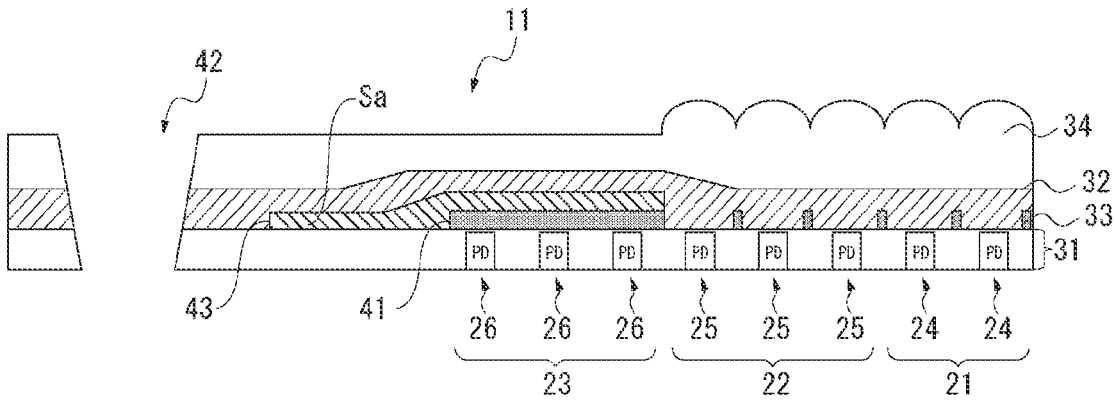
FIG. 12 is a diagram illustrating a sixth example of the formation range of the infrared pass filter.

Next, a formation range of the infrared pass filter 32 is described. FIG. 7 is a diagram illustrating a first example of the formation range of the infrared pass filter 32. FIG. 8 is a diagram illustrating a second example of the formation range of the infrared pass filter 32. FIG. 9 is a diagram illustrating a third example of the formation range of the infrared pass filter 32. FIG. 10 is a diagram illustrating a fourth example of the formation range of the infrared pass filter 32. FIG. 11 is a diagram illustrating a fifth example of the formation range of the infrared pass filter 32. FIG. 12 is a diagram illustrating a sixth example of the formation range of the infrared pass filter 32. FIGS. 7 to 12 are cross-sectional views of the pixel array unit 11.

In FIGS. 7 to 12, the effective pixel region 21, the dummy pixel region 22, and the light-shielded pixel region 23 are provided in the pixel array unit 11 in order from a right side to a left side in the drawing. Note that, in the effective pixel region 21, a part of the effective pixels 24 is illustrated. Furthermore, in FIGS. 7 to 12, a rightward direction is a direction toward the center of the effective pixel region 21, and a leftward direction is a direction toward the outside (end) of the semiconductor substrate 31.

A metal film 41 is formed on the light-shielded pixel region 23 on the one surface Sa of the semiconductor substrate 31, and the light-shielded pixel 26 is shielded from light by the metal film 41. Furthermore, a connection hole 42 for embedding a conductor connected to an electrode pad formed on the semiconductor substrate 31 is provided on a left end in the drawing.

As illustrated in FIG. 7, in the first example of the formation range of the infrared pass filter 32, the infrared pass filter 32 is formed over an entire effective pixel region 21, and is not formed on the dummy pixel region 22 and the light-shielded pixel region 23. Therefore, it is possible to at least cut the visible light out of light directly applied to the effective pixel 24 and transmit only the infrared light.

As illustrated in FIG. 8, in the second example of the formation range of the infrared pass filter 32, the infrared pass filter 32 is formed over an entire effective pixel region 21 and dummy pixel region 22, and is not formed on the light-shielded pixel region 23. This makes it possible to cut the visible light and transmit only the infrared light out of the light directly incident on the effective pixel 24, and cut the visible light and transmit only the infrared light also in the dummy pixel region 22. That is, it is possible to suppress an influence of flare due to reflection of the visible light in the dummy pixel region 22. Furthermore, the color mixing may be reduced by cutting the visible light incident on the effective pixel 24 from the adjacent dummy pixel 25 by the infrared pass filter 32.

As illustrated in FIG. 9, in the third example of the formation range of the infrared pass filter 32, the infrared pass filter 32 is formed over an entire effective pixel region 21, dummy pixel region 22, and light-shielded pixel region 23, but is not formed on the outside (end) of the semiconductor substrate 31. Note that, in the light-shielded pixel region 23, the infrared pass filter 32 is formed on the metal film 41. This makes it possible to cut the visible light and transmit only the infrared light out of the light directly incident on the effective pixel 24, and cut the visible light and transmit only the infrared light also in the dummy pixel region 22 and the light-shielded pixel region 23 by the infrared pass filter 32. That is, it is possible to further suppress the influence of the flare due to reflection of the visible light in the dummy pixel region 22 and the light-shielded pixel region 23. Furthermore, the color mixing may be reduced by cutting the visible light incident on the effective pixel 24 from the adjacent dummy pixel 25.

As illustrated in FIG. 10, in the fourth example of the formation range of the infrared pass filter 32, the infrared pass filter 32 is formed over an entire semiconductor substrate 31 including the effective pixel region 21, the dummy pixel region 22, and the light-shielded pixel region 23. This makes it possible to cut the visible light and transmit only the infrared light out of the light directly incident on the effective pixel 24, and cut the visible light and transmit only the infrared light also in a region other than the effective pixel 24 on the semiconductor substrate 31. That is, it is possible to further suppress the influence of the flare due to the reflection of the visible light in the region other than the effective pixel 24 on the semiconductor substrate 31. Furthermore, the color mixing may be reduced by cutting the visible light incident on the effective pixel 24 from the adjacent dummy pixel 25. Furthermore, it is advantageous as a countermeasure against collet scratches at the time of assembly because the infrared pass filter 32 is arranged on the entire semiconductor substrate 31.

In the fifth example of the formation range of the infrared pass filter 32 illustrated in FIG. 11 and the sixth example of the formation range of the infrared pass filter 32 illustrated in FIG. 12, the infrared pass filter 32 is formed over the entire semiconductor substrate 31 similarly to the fourth example of the formation range of the infrared pass filter 32 illustrated in FIG. 10. In contrast, in the fifth example and the sixth example of the formation range of the infrared pass filter 32, a light-shielding organic film 43 is formed on the semiconductor substrate 31 unlike the fourth example.

As illustrated in FIG. 11, in the fifth example of the formation range of the infrared pass filter 32, the light-shielding organic film 43 is formed on the infrared pass filter 32. That is, the infrared pass filter 32 is formed on a side closer to the semiconductor substrate 31 than the light-shielding organic film 43. The light-shielding organic film 43 is formed over the entire light-shielded pixel region 23 and on the outside of the light-shielded pixel region 23.

The light-shielding organic film 43 is an organic resin composition containing a color material that at least cuts the infrared light dispersed in an organic resin. Furthermore, the light-shielding organic film 43 may contain a color material that cuts the visible light. The organic resin composition desirably is a photocurable composition containing at least a photopolymerization initiator or a thermosetting composition containing at least a thermosetting resin.

As the color material, for example, an organic pigment that cuts the visible light and an organic dye that cuts the infrared light are mixed. Furthermore, the color material may contain an organic compound such as carbon black that cuts the visible light and infrared light, or a metal compound such as titanium black.

In this manner, in the fifth example of the formation range of the infrared pass filter 32, not only the visible light but also the infrared light may be cut by combining the infrared pass filter 32 and the light-shielding organic film 43 on the light-shielded pixel region 23 and on the outside of the light-shielded pixel region 23.

As illustrated in FIG. 12, in the sixth example of the formation range of the infrared pass filter 32, the light-shielding organic film 43 is formed between the metal film 41 and the infrared pass filter 32. That is, the infrared pass filter 32 is formed at a position separated from the semiconductor substrate 31 than the light-shielding organic film 43. Specifically, in the sixth example, after the metal film 41 is formed on the semiconductor substrate 31, the light-shielding organic film 43 is formed thereon, and then the infrared pass filter 32 is further formed.

In the sixth example of the formation range of the infrared pass filter 32 also, not only the visible light but also the infrared light may be cut on the light-shielded pixel region 23 and on the outside of the light-shielded pixel region 23 by combining the infrared pass filter 32 and the light-shielding organic film 43 similarly to the fifth example of the formation range of the infrared pass filter 32.

5. Configuration Example of Separation Wall

Figure 13:
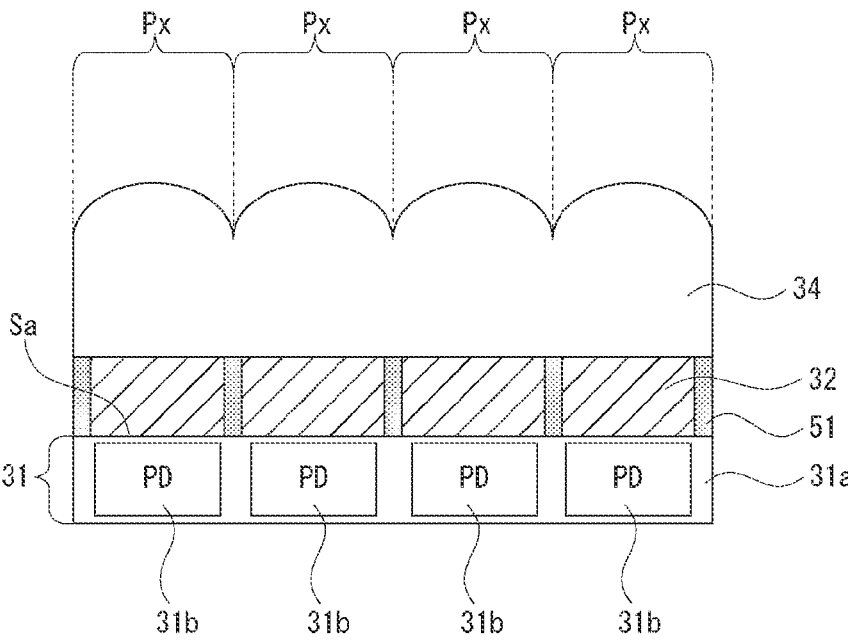
FIG. 13 is a diagram illustrating a second example of a separation wall.
Figure 14:
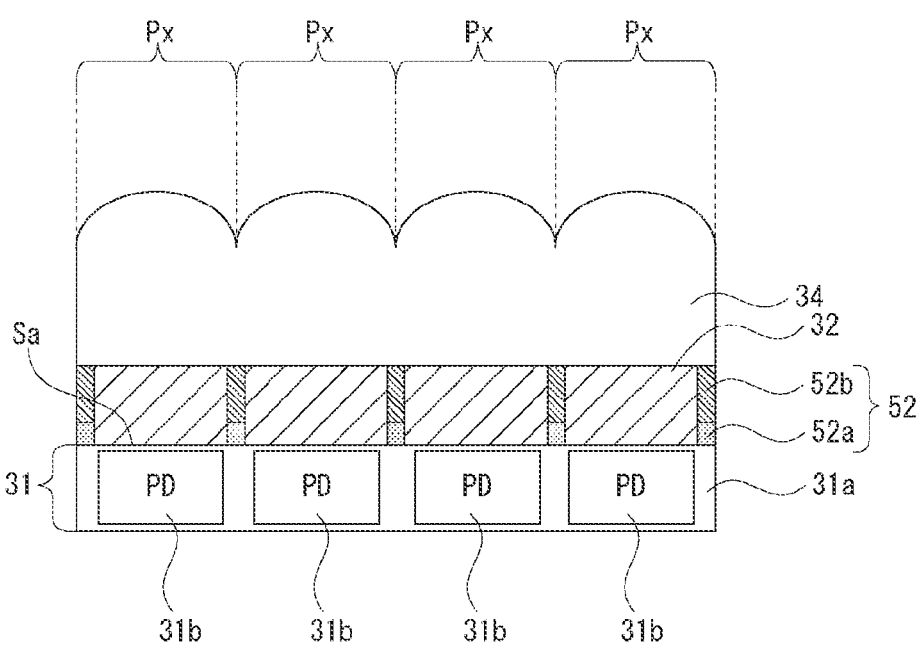
FIG. 14 is a diagram illustrating a third example of the separation wall.
Figure 15:
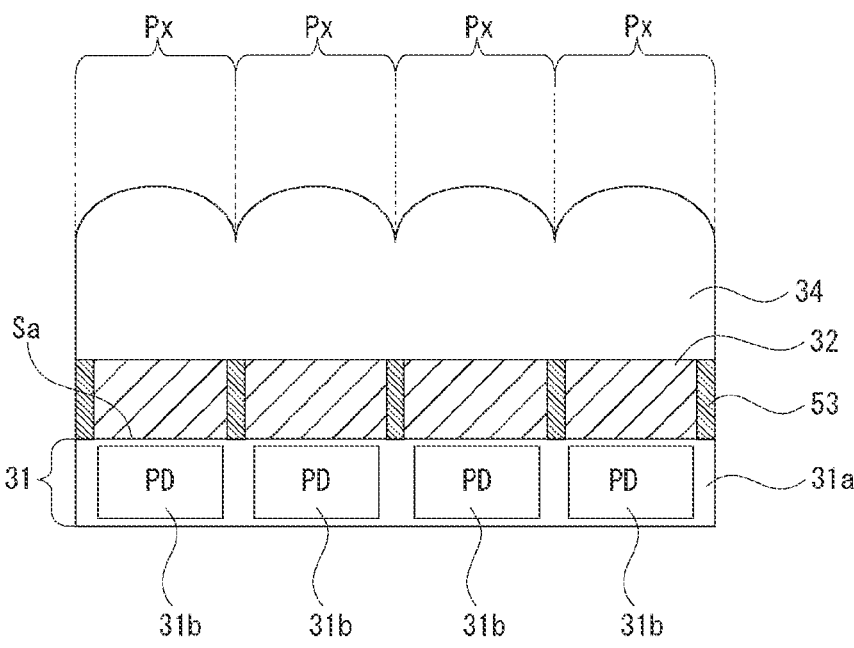
FIG. 15 is a diagram illustrating a fourth example of the separation wall.
Figure 16:
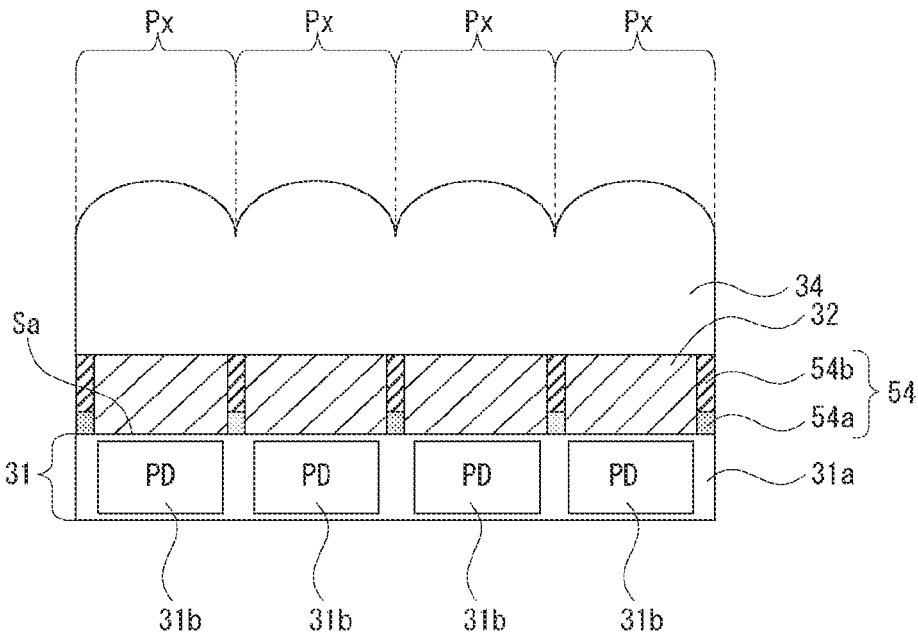
FIG. 16 is a diagram illustrating a fifth example of the separation wall.
Figure 17:
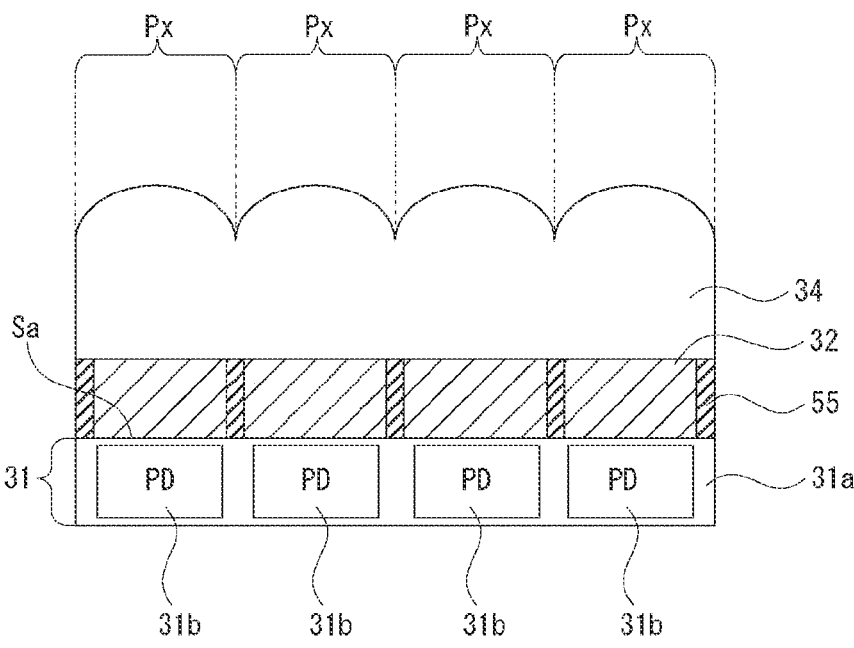
FIG. 17 is a diagram illustrating a sixth example of the separation wall.
Figure 18:
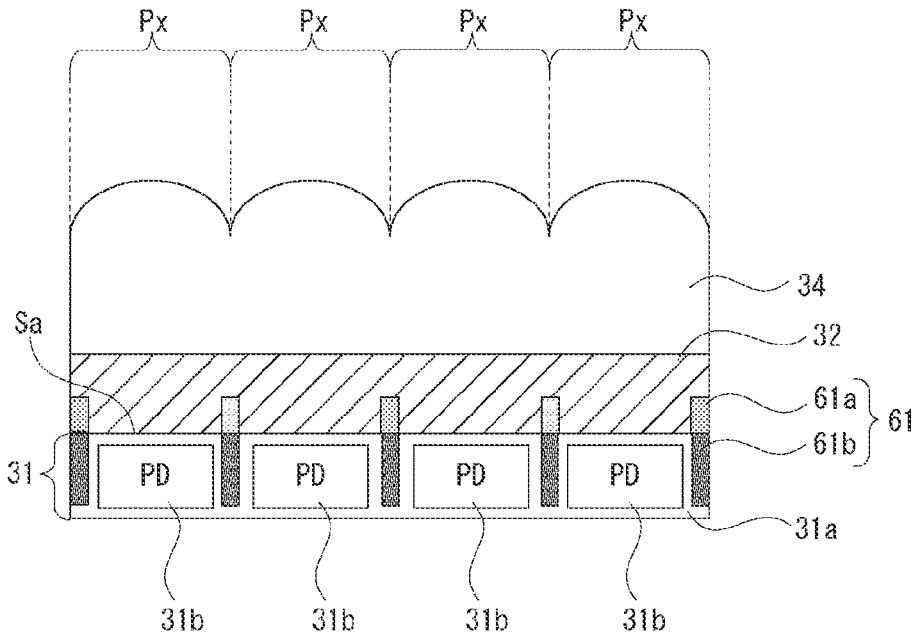
FIG. 18 is a diagram illustrating a seventh example of the separation wall.
Figure 19:
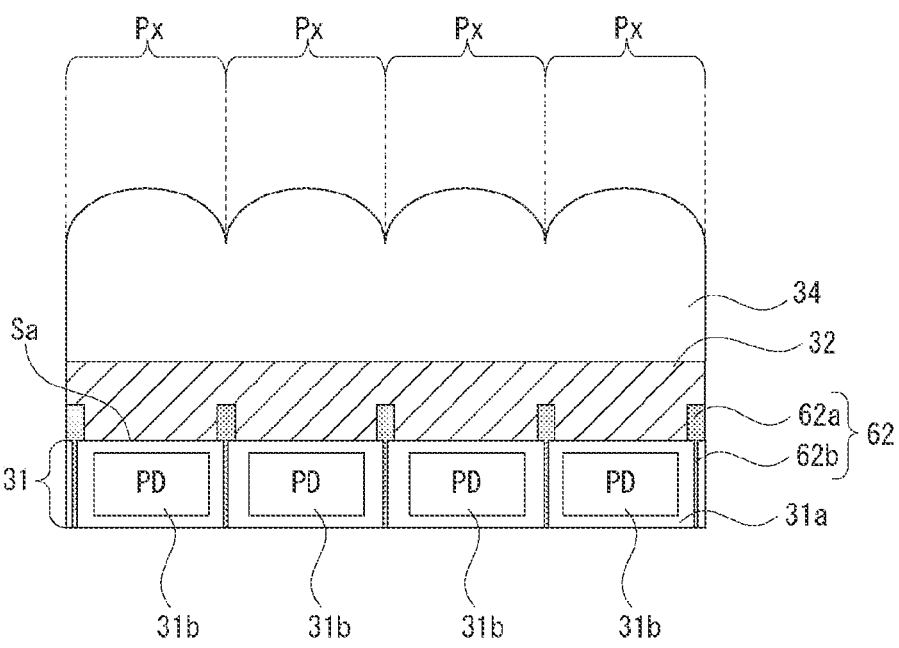
FIG. 19 is a diagram illustrating an eighth example of the separation wall.

Next, a configuration of the separation wall will be described. FIG. 2 illustrates a first example of the separation wall. FIG. 13 is a diagram illustrating a second example of the separation wall. FIG. 14 is a diagram illustrating a third example of the separation wall. FIG. 15 is a diagram illustrating a fourth example of the separation wall. FIG. 16 is a diagram illustrating a fifth example of the separation wall. FIG. 17 is a diagram illustrating a sixth example of the separation wall. FIG. 18 is a diagram illustrating a seventh example of the separation wall. FIG. 19 is a diagram illustrating an eighth example of the separation wall.

As illustrated in FIG. 2, the separation wall 33 as the first example of the separation wall is formed using the metal film of W, Al and the like, and has the height lower than that of the infrared pass filter 32. However, the material and the height (thickness) of the separation wall are not limited thereto, and may be, for example, a material and a height as illustrated in FIGS. 13 to 17.

As illustrated in FIG. 13, a separation wall 51 as the second example of the separation wall is formed using a metal film of W, Al and the like, and has the same height as that of the infrared pass filter 32. Therefore, as is understood from the first example and the second example, the separation wall is preferably formed using the metal film of W, Al and the like, and the height thereof is preferably equal to or less than the height of the infrared pass filter 32.

Furthermore, as illustrated in FIG. 14, a separation wall 52 as the third example of the separation wall is formed in such a manner that an inorganic film 52b of $SiO_2$, SiN and the like is stacked on a metal film 52a of W, Al and the like. In this case, the total height of the metal film 52a and the inorganic film 52b is preferably equal to or less than the height of the infrared pass filter 32.

Furthermore, as illustrated in FIG. 15, a separation wall 53 as the fourth example of the separation wall is formed using an inorganic film of $SiO_2$, SiN and the like. In this case, the height of the separation wall 53 is preferably equal to or less than the height of the infrared pass filter 32.

Furthermore, as illustrated in FIG. 16, a separation wall 54 as the fifth example of the separation wall is formed in such a manner that an organic resin 54b having a predetermined refractive index is stacked on a metal film 54a of W, Al and the like. In this case, the total height of the metal film 54a and the organic resin 54b is preferably equal to or less than the height of the infrared pass filter 32. Note that, the refractive index of the organic resin 54*b* desirably is 1.6 or less.

Furthermore, as illustrated in FIG. 17, a separation wall 55 as the sixth example of the separation wall is formed using an organic resin having a predetermined refractive index. In this case, the height of the separation wall 55 is preferably equal to or less than the height of the infrared pass filter 32. Note that, the refractive index of the separation wall 55 (organic resin) desirably is 1.6 or less.

Moreover, in addition to the configurations of the first to sixth examples, as illustrated in the seventh and eighth examples, the separation wall may be formed together with a PD separation wall that separates the photodiodes PD of the respective pixels Px for each pixel.

For example, as illustrated in FIG. 18, a separation wall 61 as the seventh example of the separation wall is formed using an in-filter separation wall 61*a* formed in the infrared pass filter 32 and a PD separation wall 61*b* having a DTI structure having a predetermined depth from the one surface Sa of the semiconductor substrate 31. Note that, the in-filter separation wall 61*a* is formed using a metal film of W, Al and the like, an inorganic film of SiO2, SiN and the like, an organic resin having a predetermined refractive index and the like. Furthermore, the PD separation wall 61*b* is formed by embedding an oxide film in the semiconductor substrate 31.

Furthermore, as illustrated in FIG. 19, a separation wall 62 as the eighth example of the separation wall is formed using an in-filter separation wall 62*a* formed in the infrared pass filter 32 and a PD separation wall 62*b* having a DTI structure having a predetermined depth from the one surface Sa of the semiconductor substrate 31. Then, the in-filter separation wall 62*a* and the PD separation wall 62*b* are integrally formed using a metal material of W, Al and the like.

6. Configuration Example of Semiconductor Substrate

Figure 20:
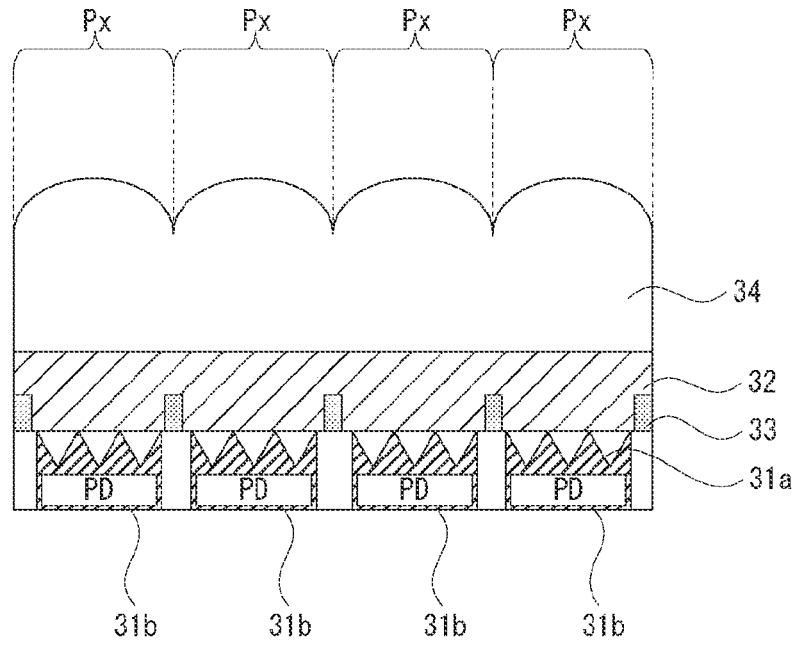
FIG. 20 is a diagram illustrating a second example of a semiconductor substrate.
Figure 21:
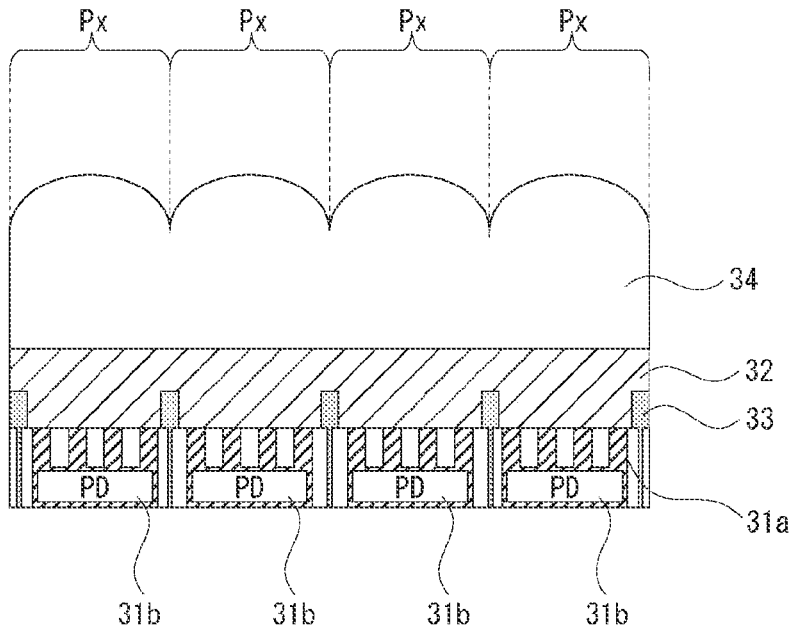
FIG. 21 is a diagram illustrating a third example of the semiconductor substrate.

Next, a configuration example of the semiconductor substrate 31 will be described. FIG. 2 illustrates a first example of the semiconductor substrate 31. FIG. 20 is a diagram illustrating a second example of the semiconductor substrate 31. FIG. 21 is a diagram illustrating a third example of the semiconductor substrate 31.

As illustrated in FIG. 2, in the first example of the semiconductor substrate 31, the N-type (second conductive type) semiconductor regions 31*b* are formed in the P-type (first conductive type) semiconductor region 31*a* in pixel units, so that the photodiodes PD are formed in pixel units. However, the semiconductor substrate 31 may have a configuration as described in the second example and the third example, for example, as long as this may detect light (infrared light).

As illustrated in FIG. 20, in the second example of the semiconductor substrate 31, in order to improve particle efficiency (Qe) due to scattering in the photodiode PD, an interface of the semiconductor region 31*a* may have a structure in which pyramid structures that are quadrangular pyramidal concave structures are periodically arranged. Then, an oxide film is formed on the interface of the semiconductor region 31*a*.

As illustrated in FIG. 21, in the third example of the semiconductor substrate 31, in the semiconductor substrate 31, in order to improve the particle efficiency (Qe) due to scattering in the photodiode PD, the interface of the semiconductor region 31*a* may have a structure in which trenching at a predetermined depth is periodically applied. Then, an oxide film is formed on the interface of the semiconductor region 31*a*.

Furthermore, the light detection element 1 may be of a surface irradiation type in which the photodiode PD receives light from a front surface side of the semiconductor substrate 31, or may be of a surface irradiation type in which the photodiode PD receives light from the back surface side of the semiconductor substrate 31.

Furthermore, the light detection element 1 may be a stacked type in which the effective pixel region 21, the dummy pixel region 22, and the light-shielded pixel region 23 are stacked on a part or all of the vertical drive unit 12, the system control unit 13, the column processing unit 14, the horizontal drive unit 15, and the signal processing unit 16.

Furthermore, the light detection element 1 may be a two-pixel sharing type in which one floating diffusion is shared by two photodiodes PD or a four-pixel sharing type in which one floating diffusion is shared by four photodiodes PD.

7. Application Example of Light Detection Element

Figure 22:
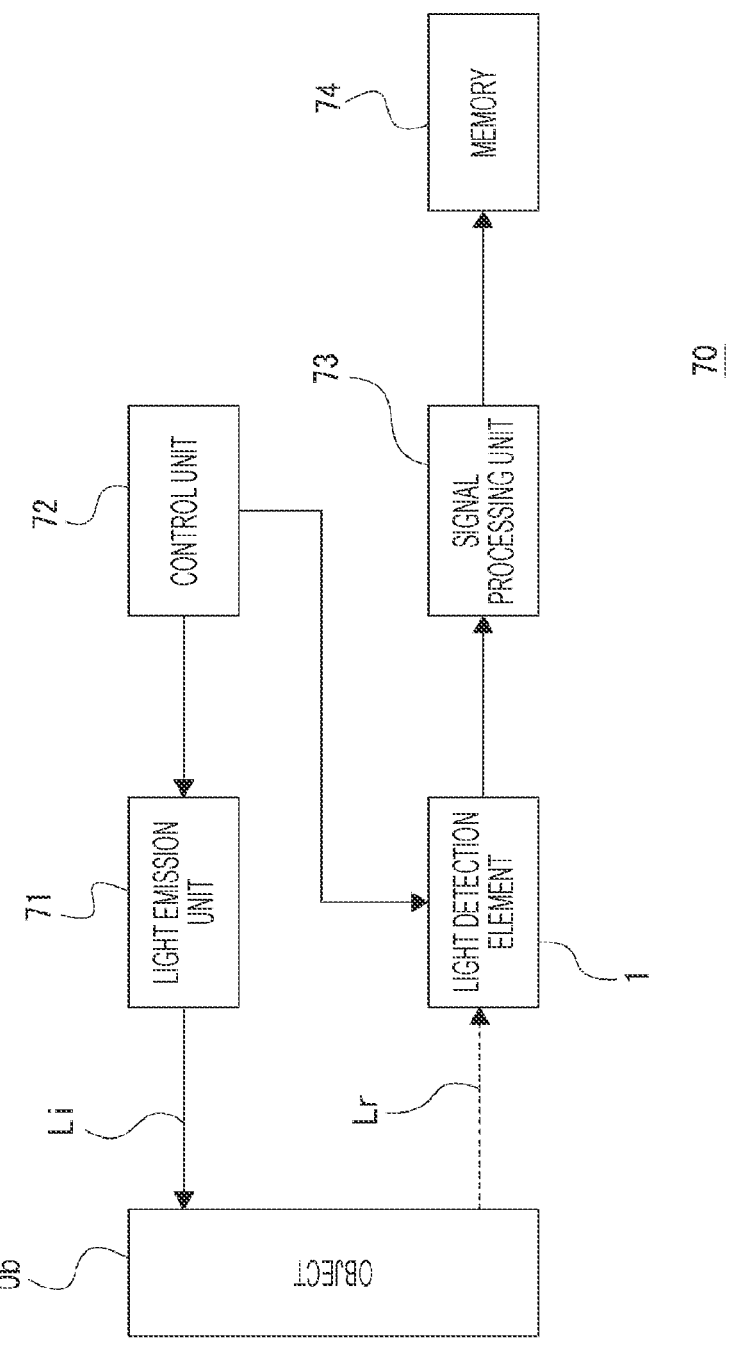
FIG. 22 is a block diagram for describing an application example of the light detection element according to the present technology.

FIG. 22 is a block diagram for describing an application example of the light detection element 1 according to the present technology. As illustrated in FIG. 22, a light detection device 70 as the application example of the light detection element 1 is provided with, for example, the light detection element 1, a light emission unit 71, a control unit 72, a signal processing unit 73, and a memory 74.

The light emission unit 71 includes one or a plurality of light emission elements as a light source, and emits irradiation light Li to an object Ob. Note that, the light detection device 70 is not required to be provided with the light emission unit 71.

The control unit 72 appropriately controls the light detection element 1 and the light emission unit 71 to cause the light detection element 1 to receive the infrared light or cause the light emission unit 71 to emit the irradiation light Li.

The signal processing unit 73 performs predetermined signal processing on a detection signal obtained by the light detection element 1 and outputs the signal to the memory 74.

The memory 74 is a storage device such as a flash memory, a solid state drive (SSD), or a hard disk drive (HDD), for example, and stores information (data) processed by the signal processing unit 73.

Here, the light detection device 70 only needs to be provided with the light detection element 1 that receives the infrared light and outputs the detection signal, and is, for example, an infrared imaging device that captures an image based on the infrared light, a ranging device that performs ranging by a time of flight (ToF) method on the basis of the infrared light and the like.

As the ranging device, a direct ToF method of calculating a distance by directly obtaining time until reflected light Lr obtained by reflection of the irradiation light Li by the object Ob returns may be applied. Furthermore, as the ranging device, an indirect ToF method of calculating a distance to the object Ob on the basis of a phase difference between the irradiation light Li to the object Ob and the reflected light Lr obtained by reflection of the irradiation light Li by the object Ob may be applied.

Furthermore, in the indirect ToF method, a current assisted photonic demodulator (CAPD) method in which a wide-range region in the substrate may be modulated at high speed by directly applying a voltage to the substrate of the sensor to generate a current in the substrate, and a gate method in which two transfer transistors and two charge accumulation units (floating diffusions) are provided for one photodiode, and charges generated by photoelectric conversion by the photodiode are alternately accumulated in the charge accumulation units by the transfer transistors may be applied. Note that, the CAPD method and the gate method are known technologies, and detailed description thereof is omitted; the CAPD method is disclosed in, for example, Japanese Patent Application Laid-Open No. 2018-117118, and the gate method is disclosed in, for example, Japanese Patent Application Laid-Open No. 2020-013909.

8. Variation

Figure 23:
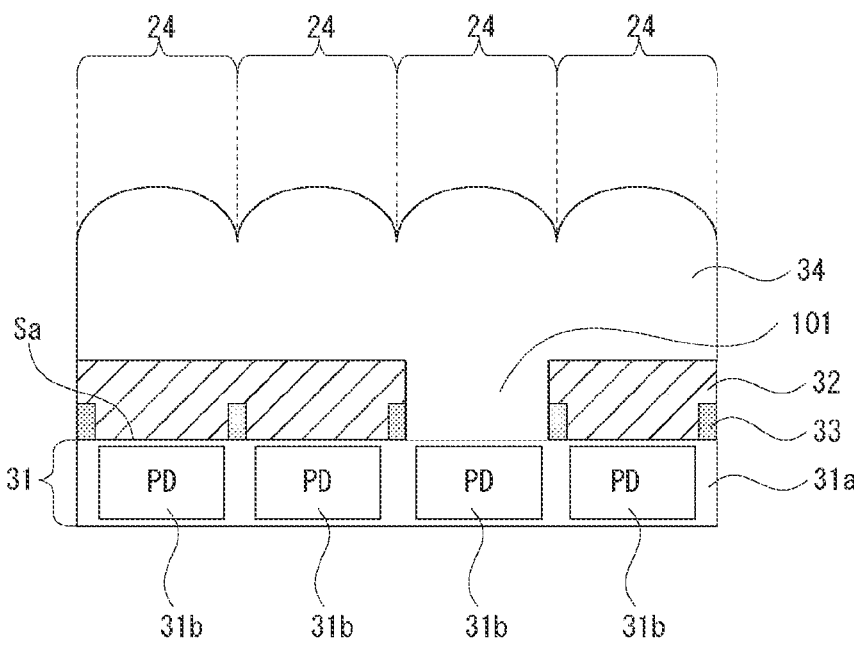
FIG. 23 is a diagram for describing a variation of the formation range of the infrared pass filter.

FIG. 23 is a diagram for describing a variation of the formation range of the infrared pass filter 32.

As described above, the infrared pass filter 32 is formed on at least the entire effective pixel region 21. However, as illustrated in FIG. 23, it is possible that the infrared pass filter 32 is formed except for a part of the effective pixels 24 arranged in the effective pixel region 21. In this case, the same material as that of the microlens 34 is applied to a region 101 where the infrared pass filter 32 is not provided.

In this manner, in the pixel array unit 11, it is only required that the infrared pass filter 32 is formed at least over a plurality of adjacent pixels Px, and the infrared pass filter 32 is not required to be formed on the entire effective pixel region 21. However, in a case where the infrared pass filter 32 is formed on the entire effective pixel region 21, an influence of the color mixing and flare may be suppressed and detection accuracy of the infrared light may be improved as compared with a case where the infrared pass filter 32 is not formed in a part of the effective pixel region 21.

Figure 24:
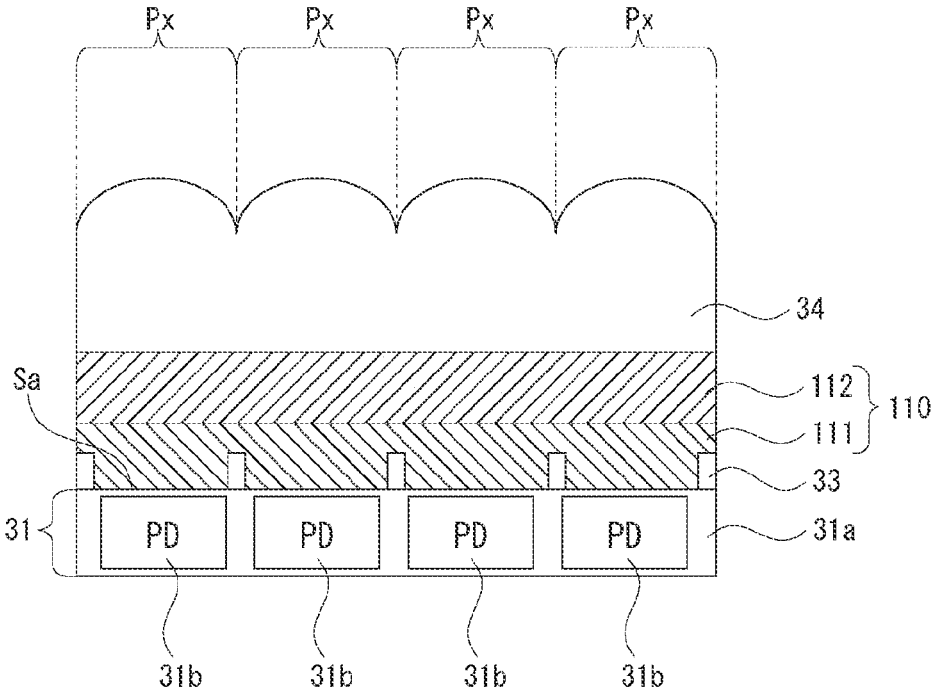
FIG. 24 is a diagram for describing a variation of the infrared pass filter.

FIG. 24 is a diagram for describing a variation of the infrared pass filter. A case where the infrared pass filter 32 described above is the organic resin composition of one layer containing the color material that cuts the visible light dispersed in the organic resin is described. However, as illustrated in FIG. 24, an infrared pass filter 110 may be formed by stacking a color filter 111 that cuts light of a red wavelength and a color filter 112 that cuts light of a blue wavelength. In this case also, the infrared pass filter 110 may cut the visible light and transmits the infrared light.

Figure 25:
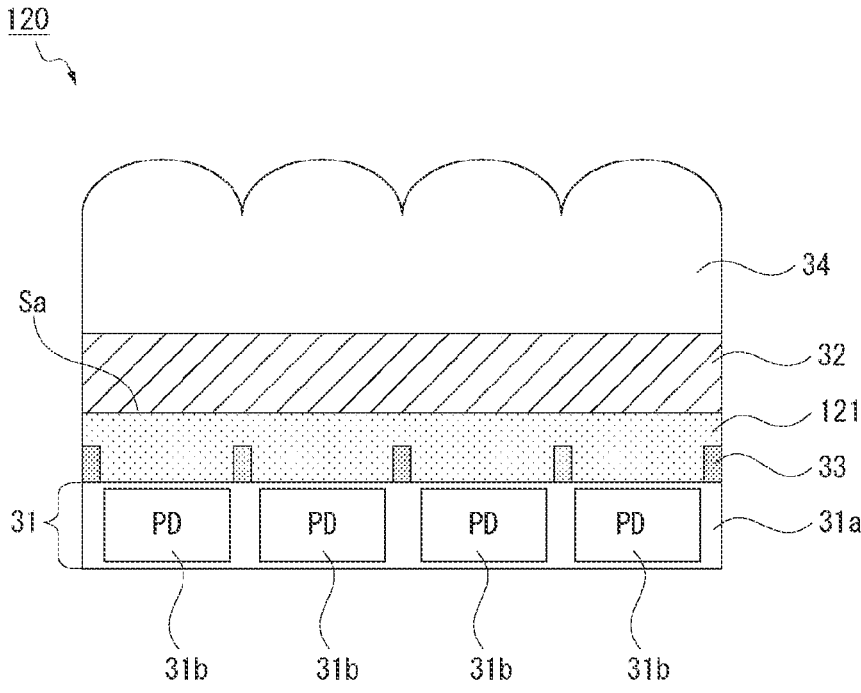
FIG. 25 is a diagram for describing a variation of the pixel array unit.

FIGS. 25 to 28 are diagrams for describing a variation of the pixel array unit. The infrared pass filter 32 is formed on the semiconductor substrate 31 so as to be in contact therewith; however, as illustrated in FIG. 25, in a pixel array unit 120, an organic flat film 121 is formed on the semiconductor substrate 31, and the infrared pass filter 32 is formed on the organic flat film 121. In this manner, the infrared pass filter 32 may be formed directly on the semiconductor substrate 31, or may be formed on the semiconductor substrate 31 via another member (here, the organic flat film 121).

Figure 26:
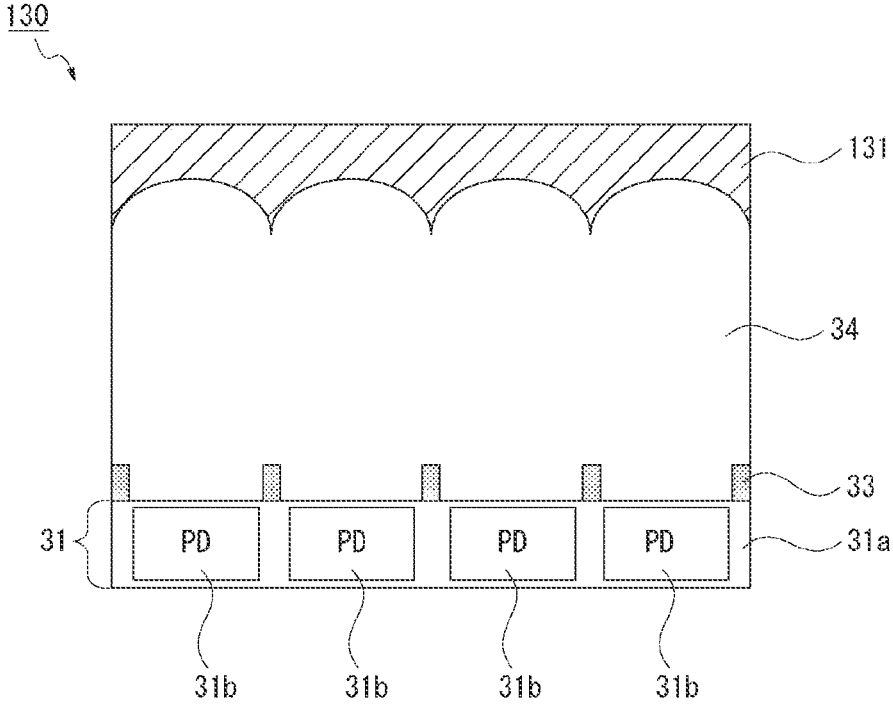
FIG. 26 is a diagram for describing the variation of the pixel array unit.

Furthermore, as illustrated in FIG. 26, in a pixel array unit 130, the microlens 34 may be formed on the semiconductor substrate 31, and an infrared pass filter 131 may be formed on the microlens 34.

Figure 27:
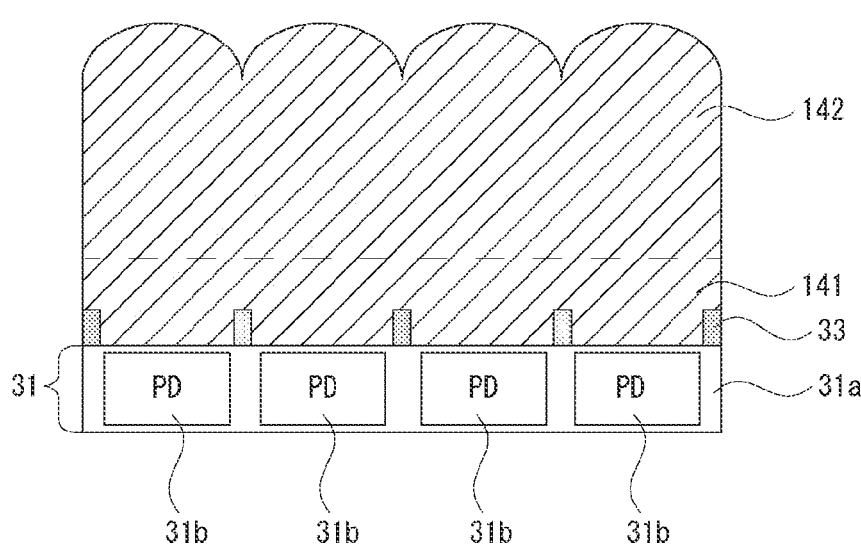
FIG. 27 is a diagram for describing the variation of the pixel array unit.

Furthermore, as illustrated in FIG. 27, in a pixel array unit 140, an infrared pass filter 141 is integrally formed using the same material (for example, an organic resin composition) as that of a microlens 142, and may serve as the infrared pass filter that cuts the visible light and transmits the infrared light, and also serve as the microlens.

Figure 28:
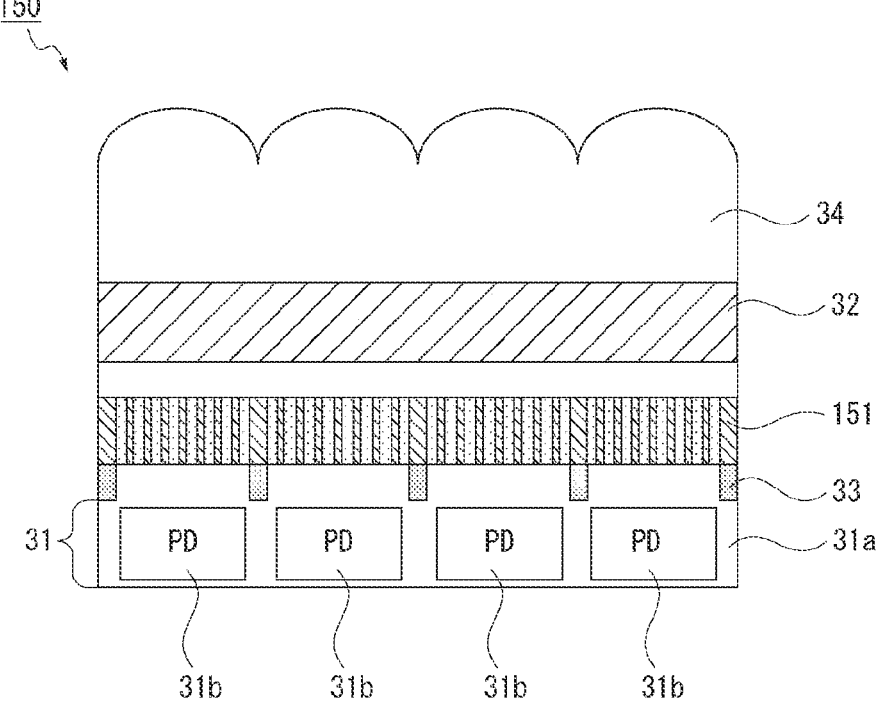
FIG. 28 is a diagram for describing the variation of the pixel array unit.

Furthermore, as illustrated in FIG. 28, in a pixel array unit 150, a polarization element 151 may be formed between the semiconductor substrate 31 and the infrared pass filter 32. Note that, the polarization element 151 may be formed using a metal film (wire grid) such as AL.

9. Summary of Embodiment

As described above, the light detection element 1 according to the embodiment is provided with the substrate (semiconductor substrate 31) on which a plurality of light reception units (photodiodes PD) is arranged in pixel units, and the filter (infrared pass filter 32) formed over a plurality of adjacent pixels on the substrate, the filter that cuts the visible light, and transmits the infrared light.

Therefore, when receiving the infrared light by the light reception unit of each pixel, it becomes possible that the light reception unit receives the infrared light in which a change in wavelength due to a difference in incident angle of light is reduced.

Therefore, the light detection element 1 may reduce an influence of the incident angle of light and improve the detection accuracy of the infrared light.

Furthermore, in the light detection element 1, it is conceivable that the filter is formed on the entire effective pixel region 21 in which the effective pixels 24 that detect the infrared light are arranged (refer to FIG. 7).

Therefore, when receiving the infrared light by the light reception unit of at least the effective pixel arranged in the effective pixel region, it becomes possible that the light reception unit receives the infrared light in which the change in wavelength due to the difference in incident angle of light is reduced.

Therefore, the light detection element 1 may improve the detection accuracy of the infrared light in all the effective pixels 24 arranged in the effective pixel region 21.

Furthermore, in the light detection element 1, it is conceivable that the filter is formed on the entire dummy pixel region 22 in which the dummy pixels 25 are arranged provided on the outside of the effective pixel region 21 (refer to FIG. 8).

Therefore, since the visible light is cut also in the dummy pixel region 22, it becomes possible to reduce the color mixing from the dummy pixel 25 and the visible light reflected by the dummy pixel region 22.

Therefore, the light detection element 1 may further improve the detection accuracy of the infrared light by reducing the color mixing from the dummy pixel 25 and the flare due to the visible light.

Furthermore, in the light detection element 1, it is conceivable that the filter is formed on the entire light-shielded pixel region 23 in which the light-shielded pixels 26 are arranged provided on the outside of the dummy pixel region 22 (refer to FIG. 9).

Therefore, since the visible light is cut also in the light-shielded pixel region 23, it becomes possible to reduce the visible light reflected by the light-shielded pixel region 23.

Therefore, by reducing the visible light reflected by the light-shielded pixel region 23 in which the light-shielded pixels 26 are formed and further reducing the flare due to the visible light, the detection accuracy of the infrared light may be further improved.

Furthermore, in the light detection element 1, it is conceivable that the filter is formed on the entire substrate (refer to FIG. 10).

This makes it possible to reduce the visible light reflected on the substrate.

Therefore, by reducing the visible light reflected on the substrate and further reducing the flare due to the visible light, the detection accuracy of the infrared light may be further improved.

Furthermore, in the light detection element 1, it is conceivable that the filter includes the material in which the color material that cuts the visible light is dispersed in the organic resin.

This makes it possible to reduce the influence of the incident angle of the incident light.

Therefore, the detection accuracy of the infrared light may be improved regardless of the incident angle of the light.

Furthermore, in the light detection element 1, it is conceivable that the filter (infrared pass filter 141) includes the same material as that of the microlens 142 that condenses light on the pixel, and is formed integrally with the microlens 142 (refer to FIG. 27).

This makes it possible to form the filter and the microlens at once.

Therefore, time and cost for forming the filter and the microlens may be reduced.

Furthermore, in the light detection element 1, it is conceivable that the microlens 34 formed on the substrate that condenses light on the light reception unit is provided, and the filter is formed on the microlens 34 formed on the substrate (refer to FIG. 26).

Therefore, it is possible to condense only the infrared light by the microlens 34.

Furthermore, in the light detection element 1, it is conceivable that the filter is formed except for a part of the effective pixels 24 in the effective pixel region 21 (refer to FIG. 23).

Therefore, a part of the effective pixels 24 may receive the visible light.

Therefore, in a part of the pixels, the visible light may be detected, and information based on the visible light may be obtained.

Furthermore, it is conceivable that the light detection element 1 is provided with the light-shielding film (light-shielding organic film 43) formed on the outside of the effective pixel region 21, the light-shielding film that cuts at least the infrared light, in which the filter is formed on a side closer to the substrate (semiconductor substrate 31) than the light-shielding film (refer to FIG. 11).

This makes it possible to reduce the reflection of the infrared light on the outside of the effective pixel region 21.

Therefore, the detection accuracy of the infrared light may be further improved.

Furthermore, it is conceivable that the light detection element 1 is provided with the light-shielding film (light-shielding organic film 43) formed on the outside of the effective pixel region 21, the light-shielding film that cuts at least the infrared light, in which the filter is formed at a position separated from the substrate (semiconductor substrate 31) than the light-shielding film (refer to FIG. 12).

This makes it possible to reduce the reflection of the infrared light on the outside of the effective pixel region 21.

Therefore, the detection accuracy of the infrared light may be further improved.

Furthermore, in the light detection element 1, it is conceivable that the light-shielding film (light-shielding organic film 43) cuts the visible light.

This makes it possible to further reduce the reflection of the visible light.

Therefore, the detection accuracy of the infrared light may be further improved.

Furthermore, in the light detection element 1, it is conceivable that the light-shielding film (light-shielding organic film 43) includes the material in which the color material that cuts the visible light is dispersed in the organic resin.

This makes it possible to reduce the influence of the incident angle of the incident light.

Therefore, the detection accuracy of the infrared light may be further improved.

Note that, the effects described in the present specification are merely examples and are not limited, and there may be another effect.

10. Present Technology

Note that, the present technology may also employ the following configurations.

(1)
A light detection element including:
a substrate on which a plurality of light reception units is arranged in pixel units; and
a filter formed over a plurality of adjacent pixels on the substrate, the filter that cuts visible light and transmits infrared light.

(2)
The light detection element according to (1), in which
the filter is formed on an entire effective pixel region in which effective pixels that detect the infrared light are arranged.

(3)
The light detection element according to (2), in which
the filter is formed on an entire dummy pixel region in which dummy pixels are arranged provided on an outside of the effective pixel region.

(4)
The light detection element according to (3), in which
the filter is formed on an entire light-shielded pixel region in which light-shielded pixels are arranged provided on an outside of the dummy pixel region.

(5)
The light detection element according to any one of (1) to (4), in which
the filter is formed on an entire substrate.

(6)
The light detection element according to any one of (1) to (5), in which
the filter includes an organic resin composition in which a color material that cuts the visible light is dispersed in an organic resin.

(7)
The light detection element according to any one of (1) to (6), in which
the filter includes a same material as a material of a microlens that condenses light on the light reception unit, and is formed integrally with the microlens.

(8)
The light detection element according to any one of (1) to (7), further including:
a microlens formed on the substrate, the microlens that condenses light on the light reception unit, in which
the filter is formed on the microlens formed on the substrate.

(9)
The light detection element according to any one of (1), and (5) to (7), in which the filter is formed except for a part of effective pixels in an effective pixel region.

(10)

The light detection element according to any one of (1) to (9), further including:

a light-shielding film formed on an outside of an effective pixel region, the light-shielding film that cuts at least the infrared light, in which the filter is formed on a side closer to the substrate than the light-shielding film.

(11)

The light detection element according to any one of (1) to (9), further including:

a light-shielding film formed on an outside of an effective pixel region, the light-shielding film that cuts at least the infrared light, in which the filter is formed at a position separated from the substrate than the light-shielding film.

(12)

The light detection element according to (10) or (11), in which the light-shielding film cuts the visible light and the infrared light.

(13)

The light detection element according to (10) or (11), in which the light-shielding film includes an organic resin composition in which a color material that cuts the visible light is dispersed in an organic resin.

REFERENCE SIGNS LIST

1 Light detection element
21 Effective pixel region
22 Dummy pixel region
23 Light-shielded pixel region
24 Effective pixel
25 Dummy pixel
26 Light-shielded pixel
31 Semiconductor substrate
32 Infrared pass filter
33 Separation wall
34 Microlens

What is claimed is:

1. A light detection element, comprising:

a substrate including a plurality of light reception units arranged as pixel units, wherein the plurality of light reception units includes:

an effective pixel region in which effective pixels that detect infrared (IR) light are arranged;

a dummy pixel region in which dummy pixels are arranged provided on an outside of the effective pixel region; and a light-shielded pixel region in which light-shielded pixels are arranged on an outside of the dummy pixel region, wherein the dummy pixel region and the light-shielded pixel region are provided adjacent to at least one side of an outer periphery of the effective pixel region;

a metal film formed on a light-incident surface of the substrate including the light-shielded pixel region; and an IR pass filter formed on the effective pixel region and the dummy pixel region, wherein the IR pass filter cuts visible light and transmits IR light.

2. The light detection element according to claim 1, further comprising a light-shielding organic film formed on at least a light-incident surface of the metal film, wherein the IR pass filter is further formed on the light-shielding organic film.

3. The light detection element according to claim 2, wherein the light-shielding organic film having the IR pass filter formed thereon is further formed on a portion of the light-incident surface of the substrate other than the effective pixel region, the dummy pixel region, and the light-shielded pixel region.

4. The light detection element according to claim 3, wherein the IR pass filter is further formed on at least a part of another portion of the light-incident surface of the substrate other than the portion of the light-incident surface on which the light-shielding organic film is formed.

5. The light detection element according to claim 1, further comprising a light-shielding organic film, wherein the IR pass filter is further formed on the metal film, and wherein the light-shielding organic film is formed on a light-incident surface of the IR pass filter opposite at least the light-incident surface of the metal film covering the light-shielded pixel region.

6. The light detection element according to claim 5, wherein the IR pass filter having the light-shielding organic film formed thereon is further formed on a portion of the light-incident surface of the substrate other than the effective pixel region, the dummy pixel region, and the light-shielded pixel region.

7. The light detection element according to claim 6, wherein the IR pass filter without having the light-shielding organic film formed thereon is further formed on at least a part of another portion of the light-incident surface of the substrate other than the portion of the light-incident surface of the substrate opposite the light-incident surface of the IR pass filter on which the light-shielding organic film is formed.

8. The light detection element according to claim 1, further comprising a microlens extending from a light-incident surface of the IR pass filter, wherein the microlens condenses light on the light reception units, and wherein the microlens is formed integrally with and of a same material as the IR pass filter.

9. The light detection element according to claim 1, wherein a part of the effective pixels of the effective pixel region is devoid of the IR pass filter being formed thereon.

10. The light detection element according to claim 1, further comprising: a light-shielding organic film formed on an outside of the effective pixel region, wherein the light-shielding organic film cuts IR light.

11. The light detection element according to claim 10, wherein the light-shielding organic film further cuts the visible light.

12. The light detection element according to claim 11, wherein the light-shielding organic film includes an organic resin composition in which a color material that cuts the visible light is dispersed in an organic resin.

13. The light detection element according to claim 1, further comprising a plurality of separation walls extending as a lattice between the effective pixels and the dummy pixels from the light-incident surface of the substrate at least partly into the IR pass filter.

14. The light detection element according to claim 13, wherein the plurality of separation walls extend from the light-incident surface of the substrate by an extent less than or equal to a thickness of the IR pass filter.

15. The light detection element according to claim 13, wherein each separation wall of the plurality of separation walls is formed of an organic resin portion and a metal film portion, wherein the metal film portion is positioned proximate to the light-incident surface of the substrate, and wherein the organic resin portion is stacked on the metal film portion.

16. The light detection element according to claim 15, wherein a refractive index of the organic resin portion is less than or equal to 1.6.

17. The light detection element according to claim 13, wherein the plurality of separation walls further extend from the light-incident surface of the substrate into the substrate to an extant less than or equal to a thickness of the substrate.

18. A light detection element, comprising:
  a substrate including a plurality of light reception units arranged as pixel units each having a photodiode, wherein the plurality of light reception units includes:
    an effective pixel region in which effective pixels that detect infrared (IR) light are arranged;
    a dummy pixel region in which dummy pixels are arranged provided on an outside of the effective pixel region; and
    a light-shielded pixel region in which light-shielded pixels are arranged on an outside of the dummy pixel region,
  wherein the dummy pixel region and the light-shielded pixel region are provided adjacent to a plurality of sides of an outer periphery of the effective pixel region;
  a film formed on a light-incident surface of the substrate including the light-shielded pixel region; and
  an IR pass filter formed on at least the effective pixel region and the dummy pixel region, wherein the IR pass filter cuts visible light and transmits IR light.

19. The light detection element according to claim 18, wherein a composition of IR pass filter includes an organic resin composition including a plurality of organic pigments having a high light-shielding property in a visible light region of red, green, and blue, and a low visible light-shielding property in an IR region, and wherein the organic resin composition of the IR pass filter further includes a near-IR absorbing dye.

20. The light detection element according to claim 18, further comprising a plurality of separation walls extending from the light-incident surface of the substrate at least partially into the IR pass filter, wherein the plurality of separation walls further extends from the light-incident surface of the substrate into the substrate between photodiodes of the effective pixels and the dummy pixels.

* * * * *